United States Patent [19]

Breen et al.

[11] Patent Number: 5,586,043
[45] Date of Patent: Dec. 17, 1996

[54] METHOD AND APPARATUS FOR MONITORING DIFFERENTIALS BETWEEN SIGNALS

[75] Inventors: Tom Breen, Lansdowne; Dhruba Das, Coatesville; Tahawar Abidi, King of Prussia, all of Pa.

[73] Assignee: General Electric Company, New York, N.Y.

[21] Appl. No.: 349,414

[22] Filed: Dec. 5, 1994

[51] Int. Cl.$^6$ .................................................. G01R 19/10
[52] U.S. Cl. ....................... 364/483; 364/487; 361/87; 324/522; 324/536; 340/664; 363/35
[58] Field of Search .................. 364/481–483, 364/487; 361/2, 7, 79, 87 XR; 324/522 XR; 340/664 XR, 825.15; 323/300; 363/35 XR

[56] References Cited

U.S. PATENT DOCUMENTS 5,452,223  9/1995  Zuercher et al. ...................... 364/483

Primary Examiner—Emanuel T. Voeltz
Assistant Examiner—Kamini Shah
Attorney, Agent, or Firm—Schnader, Harrison, Segal and Lewis

[57] ABSTRACT

A computer-implemented method and apparatus for monitoring differentials between a first signal and a second signal. According to a preferred embodiment, the first signal and second signal are sampled for a current sampling interval to provide a current first signal value and to provide a current second signal value. The first signal is compared with the second signal for the current sampling interval to determine a difference indication. At least one of the current first signal value and the current second signal value is repaired if a difference indication is determined and if fewer than a first predetermined number of repairs have been made within a second predetermined number of previous sampling intervals.

34 Claims, 4 Drawing Sheets

METHOD AND APPARATUS FOR MONITORING DIFFERENTIALS BETWEEN SIGNALS

BACKGROUND OF THE INVENTION

1. Field of the Invention

The present invention relates to methods and apparatuses for monitoring differentials between signals, and, in particular, to methods and apparatuses for improving the immunity of such devices to spurious or erroneous difference indications.

2. Description of the Related Art

It is known to use differential devices to compare two measured values of some real event or process, to detect problems, faults, or other occurrences that are indicated by a difference between the two measured values. For example, in a generator having a winding through which a given current flows, if there is no intended tap or loss of current between points A (where current enters the winding) and B (where current leaves the winding) of the current path, then current $I_A$ should be approximately equal to $I_B$. A problem such as an insulation failure in the windings causing a short circuit or related problem between points A and B, can draw away current so that $I_A$ is not equal to $I_B$. Thus, the existence of a difference between $I_A$ and $I_B$ can be used to indicate a potential problem, such as a loss of current in the windings of the generator.

It is known to monitor and compare these currents to ensure that the currents are approximately equal at all times. When $I_A$ and $I_B$ differ significantly, this may indicate that some problem has occurred between points A and B. This difference indication may be used to determine a resonse, e.g. setting off alarms to warn operators of the problem, or shutting off the generator. The difference between $I_A$ and $I_B$ may be a simple mathematical difference which is compared to a threshold value to determine if the currents differ significantly at any given point in time. Other conventional methods involve performing a fourier transform at each sampling interval on one cycle's worth of the samples (e.g. 12 samples) of $I_A$ and $I_B$ and making a more complicated comparison which indicates whether there is a significant difference between $I_A$ and $I_B$ for each sampling interval. A fault detection routine is typically configured to indicate a fault when, for example, seven such consecutive differences are indicated.

However, it is possible for a difference to be caused by spurious data or other random noise rather than by an actual fault or other problem. For example, the measured magnitude of $I_A$ may increase significantly for a brief period of time due to a voltage spike or other spurious data error. In this case $I_A$ and $I_B$ may differ significantly, thereby erroneously causing a fault to be indicated by a fault detection routine comparing the two currents. In this application such a spurious data reading may also be referred to as a "glitch" or as "noise." When such a glitch causes a fault to be indicated, it is possible that alarms may be set or systems shut down, causing great expense, inconvenience, or other problems. When a fourier transform is used, for example, a very large spurious reading of $I_A$ may affect the fourier transform calculation for an entire cycle (e.g. 12 samples), since the fourier transform utilizes the current sampled value of $I_A$ and $I_B$ and the previous 11 samples of $I_A$ and $I_B$. Thus a single spurious reading of $I_A$ may affect the fourier transform output for many consecutive samples, erroneously causing a fault to be indicated.

It is accordingly an object of this invention to overcome the disadvantages and drawbacks of the known art and to provide a computer-implemented method and apparatus for differential fault indication that is more secure in terms of being less likely to erroneously indicate a fault.

It is a further object of this invention to provide such a differential fault indicator that is more tolerant of spurious data such as noise that momentarily and falsely indicate a fault, while still providing accurate and sensitive indications of actual faults when they occur.

Further objects and advantages of this invention will become apparent from the detailed description of a preferred embodiment which follows.

SUMMARY OF THE INVENTION

The previously mentioned objectives are fulfilled with the present invention. There is provided herein a computer-implemented method and apparatus for monitoring differentials between a first signal and a second signal. According to a preferred embodiment, the first signal and second signal are sampled for a current sampling interval to provide a current first signal value and to provide a current second signal value. The first signal is compared with the second signal for the current sampling interval to determine a difference indication. At least one of the current first signal value and the current second signal value is repaired if a difference indication is determined and if fewer than a first predetermined number of repairs have been made within a second predetermined number of previous sampling intervals.

BRIEF DESCRIPTION OF THE DRAWINGS

These and other features, aspects, and advantages of the present invention will become more fully apparent from the following description, appended claims, and accompanying drawings in which:

DESCRIPTION OF THE PREFERRED EMBODIMENT

Figure 1:
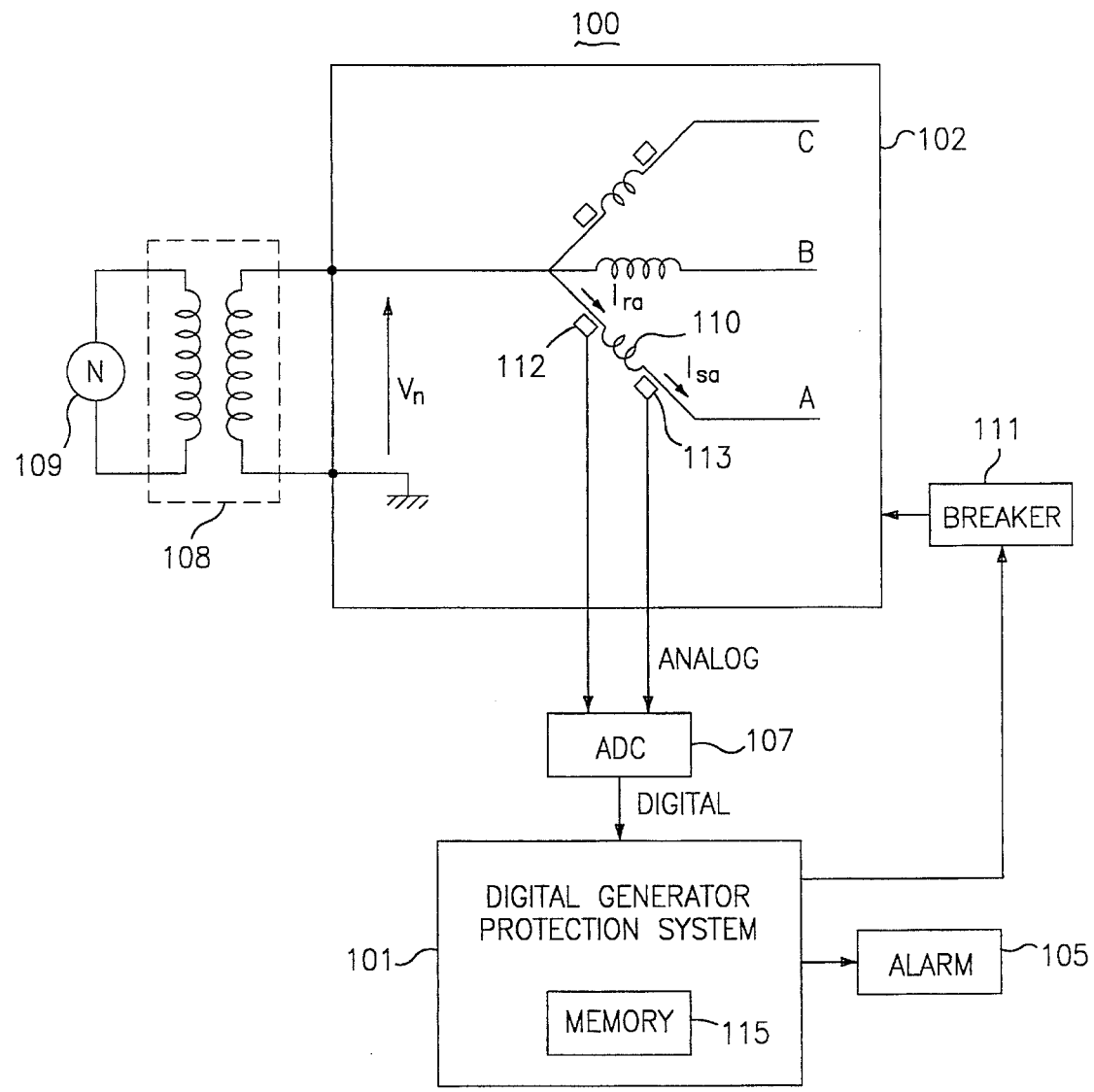
FIG. 1 is a block diagram of a generator system having a digital generator protection system, according to a preferred embodiment of the present invention.

Referring now to FIG. 1, there is shown a block diagram of a generator system 100 having a preferred digital generator protection system ("DGPS") 101 in accordance with the present invention. Generator system 100 contains a generator 102 for generating electricity. Generator 102 is a three-phase electric generator. As illustrated, generator 102 contains three stators corresponding to the three phases A, B, and C. Each phase has a winding, and phase A has winding 110, as shown. For each of the three phases A–C an AC current flows into and out of the respective phase's winding.

For example, current $I_{ra}$, the "return" current, flows into winding 110 of phase A, and current $I_{sa}$, the "source" current, flows out of winding 110. It will be understood by those skilled in the art that, during normal operation of generator system 100, the amplitude of $I_{ra}$ is approximately equal to that of $I_{sa}$ at any given moment.

Devices such as current transformers 112 and 113 are mounted along the current paths flowing into and out of winding 110, respectively. Configured in this manner, current transformer 112 senses the instantaneous analog magnitude of $I_{ra}$ and current transformer 113 similarly senses $I_{sa}$. It will be understood by those skilled in the art that current transformers 112 and 113 may drive a current proportional to the sensed current through a known resistance, so that a voltage across the resistor is formed that is proportional to the sensed current. As is known to those skilled in the art, this voltage may be sampled at a given sampling rate by an analog-to-digital converter, yielding a digital number directly proportional to the analog current sensed by the current transformer.

Current transformers 112 and 113 thus each provide an analog voltage signal to analog-to-digital converter ("ADC") 107 which is proportional to the currents $I_{ra}$ and $I_{sa}$. ADC 107 may be any analog to digital converter suitable for sampling currents $I_{ra}$ and $I_{sa}$ with current transformer 112 and 113 at 12 samples per cycle, for a typical frequency of 60 cycles per second, and for converting these signals to digital signals, and is preferably a MAX 164. Similar current transformers may also be utilized in like fashion to monitor the currents flowing through the windings of phases B and C.

In a preferred embodiment, currents $I_{ra}$ and $I_{sa}$ are 60 Hertz frequencies. ADC 107 samples the voltages which are proportional to the magnitudes of these two currents at a rate of 12 samples per cycle, or 720 samples per second. Thus, 720 times per second, or once each 1.388 ms sampling interval, ADC 107 transmits digital signals to DGPS 101 which represent the magnitude of currents $I_{ra}$ and $I_{sa}$ for that sampling interval. These digital signals are processed by DGPS 101 at every sampling interval to determine whether or not a fault has occurred with respect to phase A, as described in full detail below. DGPS 101 also performs a similar function with regard to phases B and C of generator 102, although in this specification the operation of DGPS 101 will be described with respect to phase A only. DGPS 101 may be any processor suitable for processing digital signals received from ADC 107 in the manner described herein, and is preferably a TMS 320.

DGPS 101 also contains a memory means such as memory 115, which may be used to store at least 12 magnitudes (i.e., one cycle's worth of samples) of currents $I_{ra}$ and $I_{sa}$, as well as other parameters, variables, constants, and results. DGPS 101 is further connected to a breaker 111 and to alarm 105. If DGPS 101 determines that a fault has occurred, it may thus shut off generator 102 via breaker 111 to prevent further damage, and/or may sound alarm 105 to alert an operator that a fault may be occurring. Generator 102 is typically connected to grounding transformer 108 and load resistor 109 for grounding purposes.

It will be appreciated that various methods may be used to determine whether $I_{ra}$ and $I_{sa}$ differ from each other by too much at any given sampling interval. For example, a current $I_{diff}$, which corresponds to the difference between $I_{ra}$ and $I_{sa}$, may be determined by taking the absolute value of the difference between $I_{ra}$ and $I_{sa}$ measured at each sampling interval. If the difference is nonzero and greater than a certain threshold, a difference is indicated, which may be used to indicate that currents $I_{ra}$ and $I_{sa}$ are actually different at that point in time. It will be understood that a fault is not necessarily determined just because a difference in one sample is indicated. Several consecutive difference indications, for example, may be required before a fault is determined to have occurred.

More sophisticated techniques may be utilized to determine a difference for a given sampling interval. A phasor comparison is typically utilized, and is utilized in a preferred embodiment of the present invention, to determine whether a difference is indicated at any given sampling interval. This comparison, which utilizes a dual-slope criterion, is expressed as follows:

$$|\overline{I_{ra}} - \overline{I_{sa}}|^2 > K_1 * (\overline{I_{ra}} \bullet \overline{I_{sa}}) \qquad \text{(Comparison 1)}$$

where $\overline{I_{ra}}$ is the vector current corresponding to $I_{ra}$, calculated as described below, and $\overline{I_{sa}}$ is the vector corresponding to $I_{sa}$, also calculated as described below; and where $K_1$ is a dual-slope constant having a selectable value. When the scalar dot product $\overline{I_{ra}} \bullet \overline{I_{sa}}$ is greater than $K_T$ amps, a selectable constant, $K_1$ becomes $K_1 * 15$. Comparison 1 may also be referred to in this application as a Fourier dual-slope comparison.

When Comparison 1 is true, an difference indication is output that indicates that the difference between $I_{sa}$ and $I_{ra}$ is significant for that sampling interval.

As will be understood by those skilled in the art, $\overline{I_{ra}} = P_{Ira} + j * Q_{Ira}$; and $\overline{I_{sa}} = P_{Isa} + j * Q_{Isa}$.

The scalar dot product $\overline{I_{ra}} \bullet \overline{I_{sa}}$ is computed with the equation $$\overline{I_{ra}} \bullet \overline{I_{sa}} = P_{Isa} \bullet P_{Ira} + Q_{Isa} \bullet Q_{Ira}.$$

Figure 2:
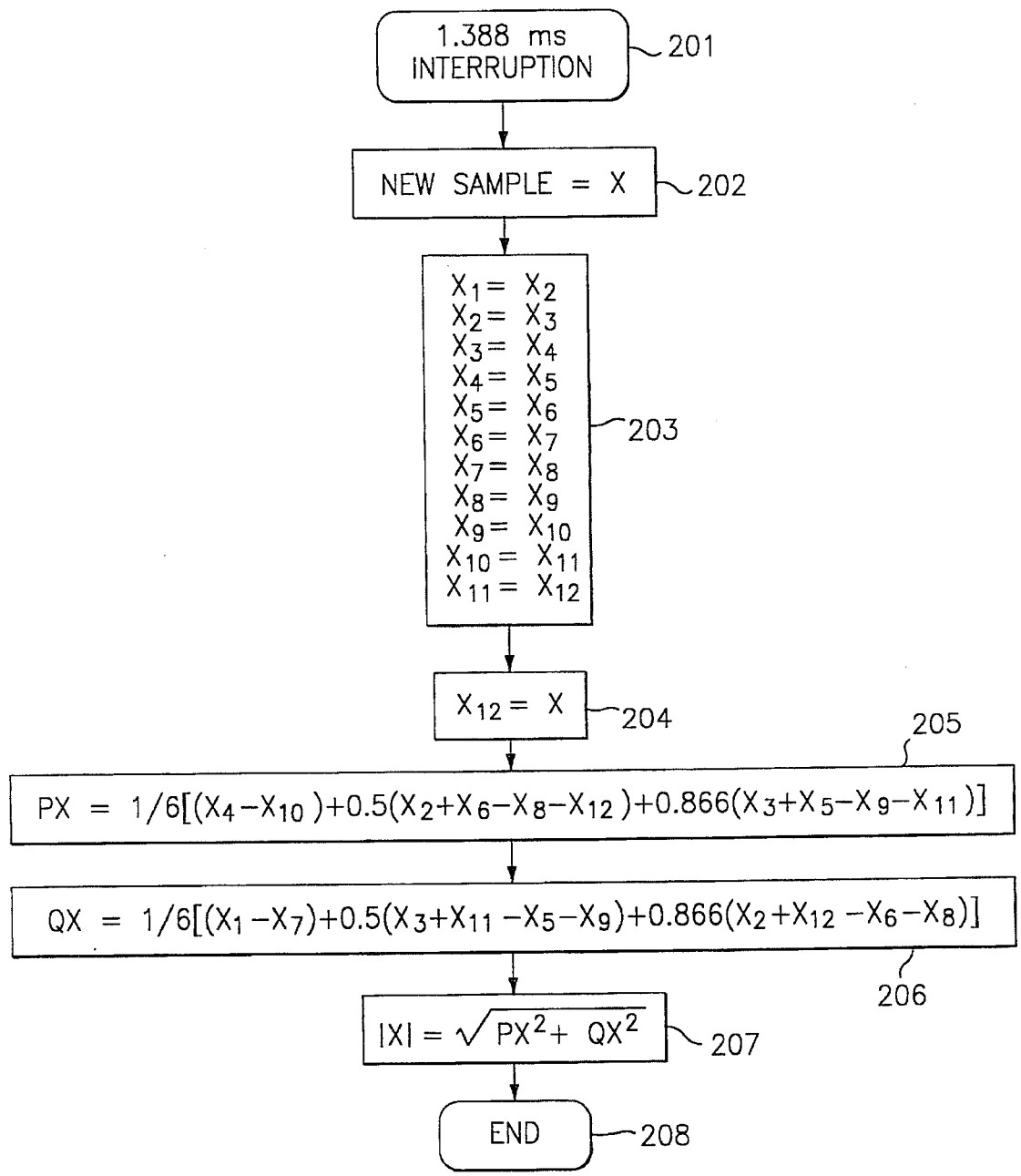
FIG. 2 is a flow diagram of a digital fourier transform phasor computation routine utilized by the digital generator protection system of FIG. 1, according to a preferred embodiment of the present invention.

Referring now to FIG. 2, there is shown a flow diagram of a digital fourier transform phasor computation routine utilized by the digital generator protection system of FIG. 1, according to a preferred embodiment of the present invention. In order to take into account both phase and amplitude differences, such a digital fourier transform phasor computation routine is typically used to compare the two magnitudes under consideration, and is utilized in a preferred embodiment of the present invention.

In a preferred embodiment of the present invention the 60 Hertz currents $I_{ra}$ and $I_{sa}$ are sampled 12 times per cycle, or once every 1.388 ms. To compute the quantities $P_x$ and $Q_x$ to determine a vector $\overline{X}$, where the instantaneous magnitude of X is provided 12 times per cycles, a continuous succession of 12 samples of X are utilized to determine each successive vector $\overline{X}$. To determine $P_x$ and $Q_x$, 12 successive samples of X, $X_1$ through $X_{12}$, which are stored in memory 115, are utilized in the equations in steps 205 and 206 to compute $P_x$ and $Q_x$. $P_x$ and $Q_x$ may then be utilized to determine $\overline{X} = P_x + j * Q_x$. Every 1.388 ms a new sample X is provided, and its value is stored into the memory space representing $X_{12}$, as shown in step 204 of FIG. 2. As shown in step 203, the value that was previously stored in the space for $X_{12}$ is stored in the memory space representing $X_{11}$, and so on until $X_1$ receives the value stored during the previous sample in $X_2$, where $X_1$ stores the oldest of the 12 samples. In this manner the memory spaces storing values $X_{12}$ through $X_1$ in memory contain the current sample of X plus the previous 11 samples of X.

Also as shown in step 207 of FIG. 2 is the manner of computing an absolute value such as $|\overline{I}_{ra}-\overline{I}_{sa}|$ which may be utilized in computations involved in the performing of Comparison 1.

It will be appreciated by those skilled in the art that the more different are the values of $I_{ra}$ and $I_{sa}$ sampled, the more likely is Comparison 1 to output a difference indication (i.e. produce a "true" result), since then at least one of the 12 sample-pairs utilized in Comparison 1 differ from each other. Additionally, the more pairs of $I_{ra}$ and $I_{sa}$ that are different from one another within the last 12 samples, the more likely is Comparison 1 to output a difference indication. Those skilled in the art will further appreciate that the difference indication of Comparison 1 is sensitive to both phase and magnitude differences between $I_{ra}$ and $I_{sa}$ because a fourier transform is used to compute the vectors $\overline{I}_{sa}$ and $\overline{I}_{ra}$. Typically, a fault detection routine running on DGPS 101 will be programmed to determine that there is a fault when, for example, seven such consecutive difference indications are output by Comparison 1.

It will further be understood by those skilled in the art that if a very large value of, for example, $I_{ra}$ is measured for one sample due to noise, causing a very large difference between $I_{ra}$ and $I_{sa}$ for that sampling interval, then vector $\overline{I}_{ra}$ could be affected for 12 samples, i.e. an entire cycle, until the noisy sample $I_{ra}$ is flushed out of the group of 12 samples of $I_{ra}$ utilized to compute $\overline{I}_{ra}$. Therefore, it is possible for some single-sample, isolated, spurious measurements to cause Comparison 1 to output a difference indication for up to 12 samples, until the spurious sample no longer influences the vector calculations utilized in Comparison 1. Where only seven consecutive difference indications need to be output before a fault detection routine will indicate a fault, one "bad" sample can cause a fault to be detected, which might set off alarm 105 or shut off generator 102 using breaker 111 as described above.

Therefore, in the present invention DGPS 101 is designed to avoid such problems by "repairing" a certain number of such spurious data readings within a given window of time (referred to as a "repair window" in this application), so that such errors do not affect the computation involved in Comparison 1. As utilized in this application and as disclosed in further detail below, the term "repair" means that certain isolated values which cause Comparison 1 to indicate a difference are not stored in memory for subsequent use by Comparison 1, but instead, an "expected" value is stored that will not necessarily cause Comparison 1 to output a difference indication.

In a preferred embodiment, DGPS 101 will repair up to two such spurious samples, whether consecutive or not, but will not repair any more until after 144 samples from the first spurious sample. Thus, for example, if two spurious samples occur within a 144-sample window, they may considered to be mere noise or glitches and ignored by Comparison 1. If, however, a third spurious sample (i.e., a sample that causes a difference indication to be output from Comparison 1) occurs within 144 samples of the first spurious sample, the third spurious sample is not repaired, so that it may be used in the subsequent performances of Comparison 1 in case a fault is actually occurring. When a fault is detected after, for example, a repair is not made, the system may respond in various ways such as setting off alarms, as described above. In this manner difference indications may be utilized to determine a response where no repair is made for a given spurious sample.

In this manner, occasional spurious samples will not cause DGPS 101 to erroneously indicate a fault. On the other hand, if a fault truly occurs, the two values $I_{sa}$ and $I_{ra}$ will be very different for many consecutive samples, and repairs will be made for only the first two samples. This could delay the detection of an actual fault at the balance point by at most two samples, or 2*1.388 ms=2.777 ms. Thus, the security of DGPS 101 is greatly increased while only slightly decreasing the temporal sensitivity in detecting actual faults. The manner in which DGPS 101 accomplishes the foregoing is described in further detail below.

Figure 3:
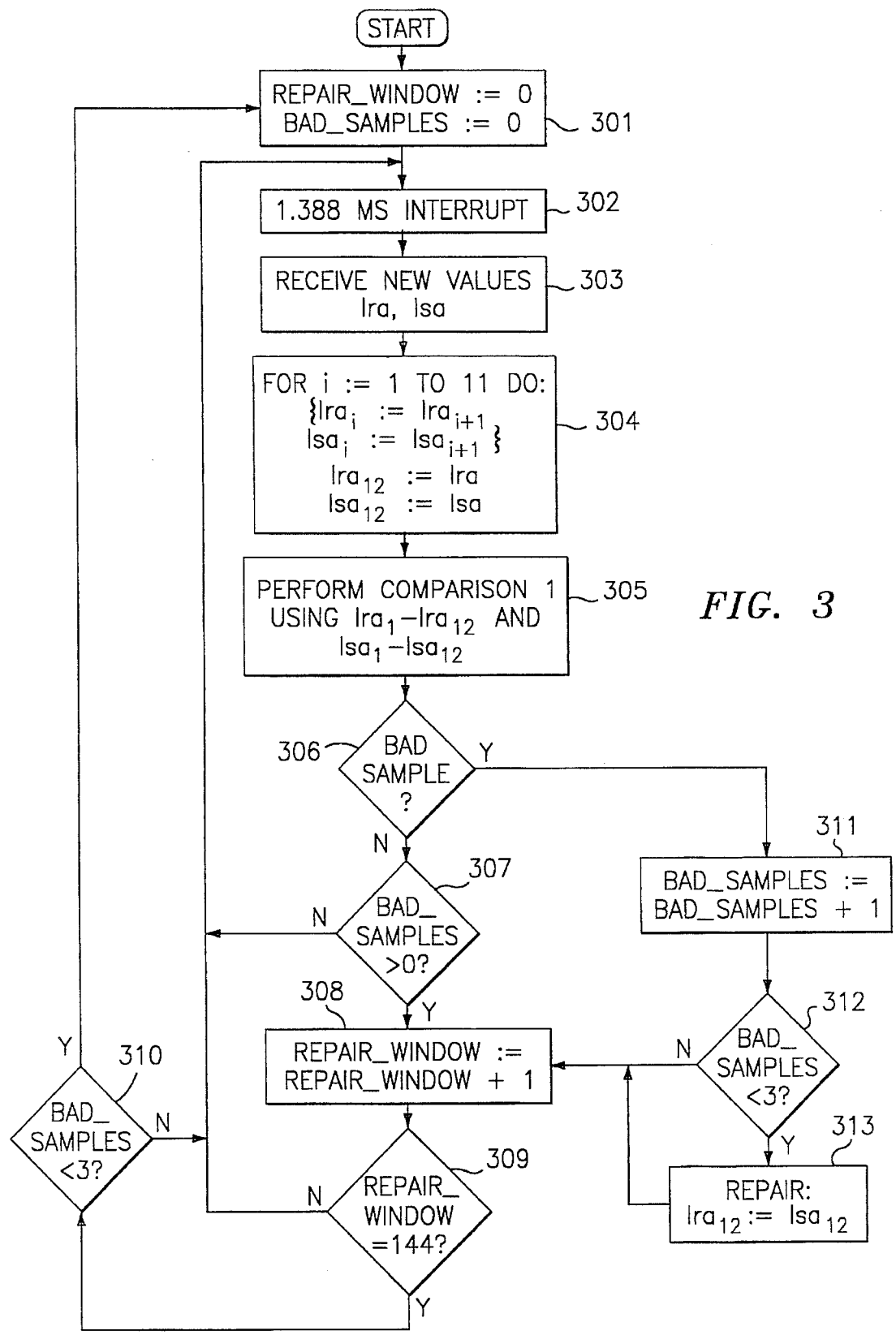
FIG. 3 is a flow diagram illustrating the method of operation of the digital generator protection system of FIG. 1, according to a preferred embodiment of the present invention.

Referring now to FIG. 3, there is shown a flow diagram illustrating the method of operation of DGPS 101 of FIG. 1, according to a preferred embodiment of the present invention. Memory 115 is utilized to store variables Repair_Window and Bad_Samples, as well as the values $I_{ra1}$ to $I_{ra12}$ and $I_{sa1}$ to $I_{sa12}$. Bad_Samples represents the number of sampling intervals during a current repair window during which Comparison 1 outputs a difference indication. Repair_Window represents the number of sampling intervals that have elapsed since a first repair was made. $I_{ra12}$ and $I_{sa12}$ represent the magnitudes of $I_{ra}$ and $I_{sa}$ measured during the current sampling interval. $I_{ra1}$ and $I_{sa1}$ represent the magnitudes of $I_{ra}$ and $I_{sa}$ measured 11 sampling intervals previously, $I_{ra2}$ and $I_{sa2}$ being those measured 10 sampling intervals previously, and so forth. $I_{ra1}$–$I_{ra12}$ and $I_{sa1}$–$I_{sa12}$ therefore represent on cycle's worth of samples of the two currents being compared and are the values utilized by Comparison 1 at each sample to determine whether to output a difference indication for that sampling interval.

As seen in step 301 of FIG. 3, Repair_Window and Bad_Samples are initially set to zero. Every 1.388 ms (i.e., for each consecutive sampling interval), new values of $I_{ra}$ and $I_{sa}$ are received (steps 302 and 303) from ADC 107 of FIG. 1. As illustrated in step 203 of FIG. 2 and in step 304 of FIG. 3, the samples in $I_{ra12}$ to $I_{ra2}$ of memory 115 are moved into $I_{ra11}$ to $I_{ra1}$, and similarly for the $I_{sa}$ values. $I_{ra12}$ receives the new value of $I_{ra}$ and $I_{sa12}$ receives the new value of $I_{sa}$ (step 304). Comparison 1 is then performed for the current sampling interval utilizing $I_{ra1}$–$I_{ra12}$ and $I_{sa1}$–$I_{sa12}$ (step 305).

If Comparison 1 outputs a difference indication (i.e. if the comparison is true), then the current sampling interval is considered to have a "bad" sample of $I_{ra}$ and $I_{sa}$ (step 306), since Comparison 1, using the newly-received samples (currently stored in $I_{ra12}$ and $I_{sa12}$), indicates a significant difference between $\overline{I}_{ra}$ and $\overline{I}_{sa}$. If there is not a "bad" sample, and if Bad_Samples is zero, then the current values being sampled are roughly identical and no difference has yet been indicated within a repair window, and the process is therefore simply repeated for the next sampling interval (steps 306, 307), until the first bad sample is actually received. As soon as the first bad sample is received, Bad_Samples is incremented by one (step 311). At this point, only one bad sample would have been received, so it is repaired (steps 312, 313), in the following manner.

Figure 4:
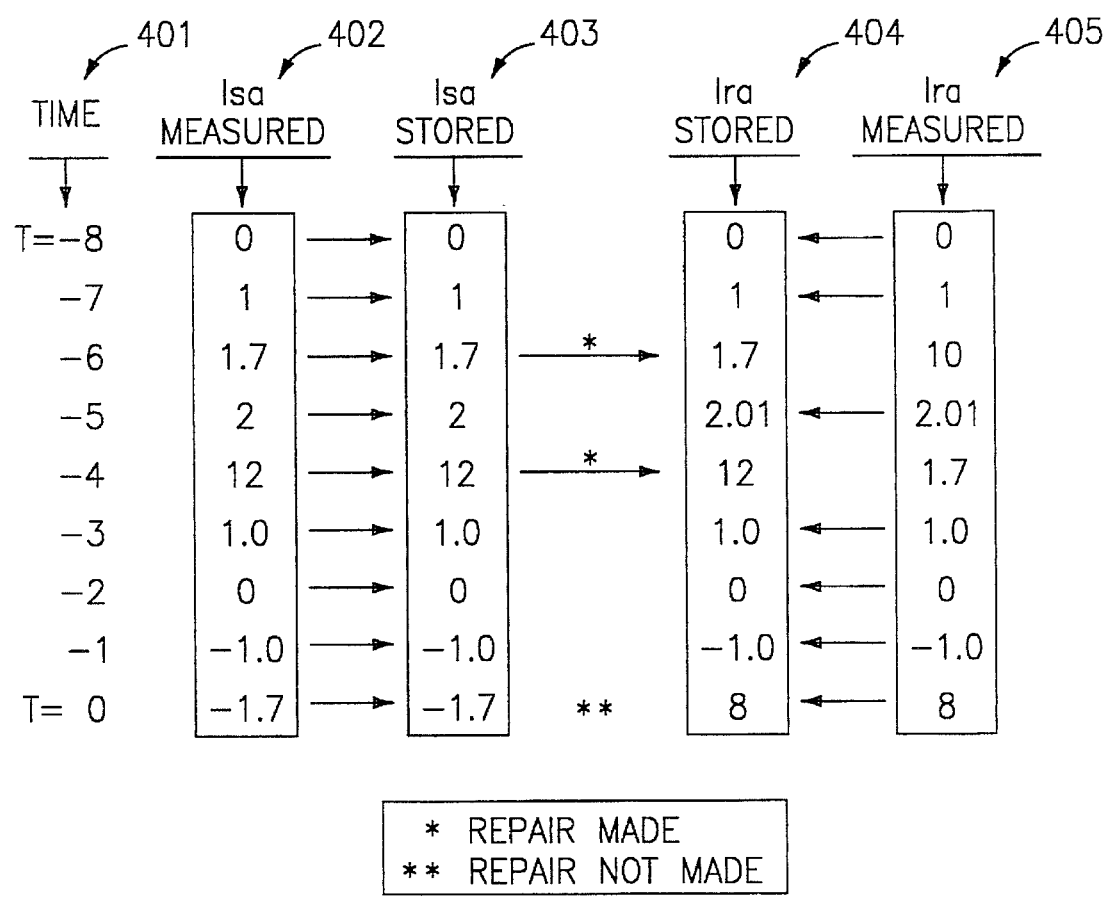
FIG. 4 depicts several typical values of two current magnitudes stored in a memory of the digital generator protection system of FIG. 1, according to a preferred embodiment of the present invention.

Referring now to FIG. 4, there are shown several typical values of $I_{ra}$ and $I_{sa}$ stored in memory 115 of DGPS 101 of FIG. 1, according to a preferred embodiment of the present invention. If at time T=–8 (column 401) a zero value is measured for both $I_s$a and $I_{ra}$ (columns 402 and 405), and if Comparison 1 therefore does not output a difference indication using these values, both values will be stored as $I_{sa12}$ and $I_{ra12}$ in memory 115 (columns 403, 404) so that these values will be also utilized for the next 11 samples by Comparison 1, as illustrated by the arrows in FIG. 4. If at time T=–6 very different values of $I_{sa}$ and $I_{ra}$ are measured, for example 1.7 and 10 Amps, respectively, such a large difference may cause Comparison 1 to output a difference indication. However, the $I_{ra}$ value measured as 10 Amps (and stored initially in $I_{ra12}$) may be a spurious data error. If it remains stored in $I_{ra12}$, then in the next sampling interval it will be stored in $I_{ra11}$, and so on until it is finally flushed out of the cycle's worth of samples utilized by Comparison 1.

Thus, for 12 samples, if either the relatively low value of 1.7 Amps for $I_{sa}$, or the relatively high value of 10 Amps for $I_{ra}$, are retained in $I_{sa12}$ or $I_{ra12}$, then the single spurious $I_{ra}$ of 10 Amps measured at time T=−6 can affect Comparison 1 for the next 11 sampling intervals, and can potentially cause Comparison 1 to output a difference indication many times. For a fault detection routine that determines a fault after, for example, seven consecutive difference indications of Comparison 1, the single spurious error may cause a fault to be indicated. For this reason, the actual value of $I_{ra}$ initially stored in $I_{ra12}$ is "repaired" by replacing it with the value currently stored in $I_{sa12}$, so that the stored values are equal rather than different. In this example, $I_{sa}$ of 1.7 Amps was stored in $I_{sa12}$, and $I_{ra}$ of 10 Amps was initially stored in $I_{ra12}$, but $I_{ra12}$ will be repaired and the value 10 will be replaced by 1.7. Thus, the values of $I_{ra}$ and $I_{sa}$ that are actually stored in memory 115 for the next 11 Comparison 1 steps are identical, so that Comparison 1 will be less likely to output a difference indication based solely on the one spurious glitch. In this manner, the bad sample at time T=−6 is repaired and DGPS 101 comprises a means for repairing the measured quantities.

It will be understood that other means for repairing the current sample may perform the same function. As long as the same value of $I_{ra}$ and $I_{sa}$ are stored in memory 115, it is not necessary to determine which is the glitch and which is the expected measurement. Thus, as shown at time T=−4 in FIG. 4, a second noise error causes a very high $I_{sa}$ of 12 Amps to be measured, which is repaired by storing the 12 in $I_{sa12}$ into $I_{ra12}$, thus overwriting the previous value of 1.7 stored in $I_{ra12}$, even though 12 was the spurious value and 1.7 was the correct value.

In a preferred embodiment of the present invention, repairs are made by storing the current, stored value of $I_{sa}$ (which is stored in $I_{sa12}$ in memory 115) the memory location for the current value of $I_{ra}$ (i.e., $I_{ra12}$), regardless of which value was spurious, because $I_{sa}$ is utilized for other calculations and its actual value may be desirable to retain in memory 115 even if a repair is made. However, it will be appreciated that a repair may in alternative preferred embodiments of the present invention be made by storing $I_{ra}$ into $I_{sa}$; or, alternatively, a spurious value may be repaired by replacing it with an "expected" value determined by interpolation from previous values of that measured current. It will be understood that either or both $I_{ra}$ and $I_{sa}$ may be repaired by storing values that are close to each other such that the difference between them caused by a spurious noise error will not be stored in memory.

Referring once more to FIG. 3, the first bad sample is repaired in step 313 by copying the value of $I_{sa12}$ into $I_{ra12}$ in memory 115, to repair the sample in the manner described above with respect to FIG. 4. Thereafter, Repair_Window is incremented by one (step 308) to keep track of how many sampling intervals have elapsed since the first repair was made. At this first repair, the repair window will not yet be 144 samples long (it will be 1 sample long), so the process will be repeated beginning with the next sampling interval (steps 309, 302). If a second bad sample is received within 144 samples of the first repair, a second repair will be made (steps 306, 311, 312, 313).

If a third bad sample is received within 144 samples of the first repair, it is not repaired (step 312). In this case, the two different values of $I_{ra}$ and $I_{sa}$ received for that sampling interval will remain in $I_{ra12}$ and $I_{sa12}$, and will thus be utilized by Comparison 1 during the next 11 sampling intervals.

If after 144 samples two or fewer repairs have been made (i.e. there have been only two bad samples, at most), then Repair_Window and Bad_Samples are reset so that the repairing process may start over again (steps 309, 310, 301).

If, however, three or more bad samples are received within the 144-sample repair window (the first two of which will have been repaired), Repair_Window and Bad_Samples will not be reset (steps 309, 310), so that further bad samples will not be repaired and a fault detection routine may then determine whether to indicate a fault depending upon the output of consecutive Comparison 1 steps. In this case Repair_Window and Bad_Samples will not be reset even at the end of the 144-sample window (steps 309, 310), because if three bad samples appeared during the repair window this may be indicative of an actual fault and no further repairs should be made.

Referring again to FIG. 4, there is shown at time T=0 the receipt of a third bad sample which is not repaired. In this case the actual values of $I_{ra}$ and $I_{sa}$ (−1.7 and 8, respectively) are stored directly in memory 115 (into $I_{ra12}$ and $I_{sa12}$, respectively) and no repair is made. It will further be appreciated that small differences between $I_{ra}$ and $I_{sa}$, such as 2 and 2.01 at time T=−5 in FIG. 4, that do not cause Comparison 1 to output a difference indication, will not cause a "bad" sample. Thus, neither values is repaired and the two slightly different values will be stored in memory 115 and will be utilized by the next 11 Comparison 1 steps (step 305 of FIG. 3).

In this manner, DGPS 101 will repair up to two bad samples received within a 144-sample repair window, and will reset the repair window after 144 samples if at most two bad samples occurred, so that further repairs may be made of further spurious errors that are subsequently received. However, if more than two bad samples are received during a given 144-sample repair window, the first two bad samples will be repaired, but subsequent samples will not be repaired, and thus will feed data to a fault detection routine so that a fault may be determined if one is actually occurring.

It will be understood that the parameters utilized in DGPS 101 may be selected by trial and error depending upon the nature of the system being monitored. For example, the repair window size of a preferred embodiment of DGPS 101 is 144 samples, and only two bad samples are repaired within a given repair window. If the system is configured to repair at most one bad sample, a second spurious noise error could erroneously cause a fault to be indicated. However, if a third bad sample is received within a relatively close time to the first two bad samples (i.e., within the 144-sample repair window), the probability that the bad samples are caused by noise decreases and the chance that a fault is occurring increases, and thus it has been determined in practice by trial and error that only two samples will be repaired within a 144-sample window.

For a larger bad sample window, a larger number of bad samples may be repaired because a larger number of spurious samples are likely to be received in a larger sample. Likewise, for a smaller bad sample window, only one sample may be repaired rather than two. Alternatively, it will be understood that if a larger security from false errors is desired and a lower sensitivity to detecting actual faults is tolerable, the number of repairs that will be made during a given window may be increased, or the repair window size may be decreased for a given number of repairs to be made within the window.

Further, the parameters disclosed above with respect to a preferred embodiment of the present invention are those used with a 60 Hertz system and an ADC sampling 60 Hertz currents 12 samples per cycle. It will be appreciated that the repair window size and the number of repairs that will be made may vary depending upon the current frequency and sampling ratio used. For example, for a 60 Hertz current sampled 24 times per cycle, more than two samples might be repaired within a 288-sample repair window, because the number of samples is increased for the same length of time (i.e. 12 cycles) and thus the probability of receiving a spurious sample increases.

It will further be understood by those skilled in the art that magnitudes measured at two measurement points A and B within a system may be related to each other by a non-unity relation, and that the present invention may also be utilized with other systems in which differentials are monitored. For example, in a power transformer, the current in the first coil will be different from, but directly related to, the current in the second coil when the transformer is operating correctly. In this case it will be understood that before the currents in the two coils are compared, magnitude and phase difference will be taken into account in accordance with the nature and characteristics of the system so that a comparison such as Comparison 1 will not output a difference indication when the transformer is operating appropriately and with no faults. It will also be understood that, although a digital generator protection system is described above, the present invention may also be utilized with other systems in which differentials are monitored, such as transformers or power line transmission systems.

It will be understood that various changes in the details, materials, and arrangements of the parts and features which have been described and illustrated above in order to explain the nature of this invention may be made by those skilled in the art without departing from the principle and scope of the invention as recited in the following claims.

What is claimed is:

1. A computer-implemented method for monitoring differentials between a first signal and a second signal, the method comprising the steps of:
   (a) sampling the first signal and sampling the second signal for a current sampling interval to provide a current first signal value and to provide a current second signal value;
   (b) comparing the first signal with the second signal for the current sampling interval to determine whether there is a difference between the first and second signals for the current sampling interval; and
   (c) repairing at least one of the current first signal value and the current second signal value if both:
      (1) a difference is determined in step (b) for the current sampling interval; and
      (2) for a first predetermined number of previous sampling intervals, fewer than a second predetermined number of repairs have been made.

2. The method of claim 1, further comprising the step of:
(d) where no repair is made in step (c), then using the difference determined in step (b) to determine a response.

3. The method of claim 1, wherein the first signal and the second signal are AC signals.

4. The method of claim 3, wherein step (b) comprises the step of performing a Fourier dual-slope comparison between the first signal and the second signal.

5. The method of claim 3, wherein:
   step (a) further comprises the step of storing the current first signal value into a first memory location and storing the current second signal value into a second memory location; and
   step (c) further comprises the step of copying the contents of the second memory location into the contents of the first memory location.

6. The method of claim 5, wherein the first signal is a first electrical current and the second signal is a second electrical current.

7. The method of claim 6, wherein the first electrical current is a current entering a winding of a generator system and the second electrical current is a current leaving the winding.

8. The method of claim 7, wherein step (b) comprises the step of performing a Fourier dual-slope comparison between the first signal and the second signal.

9. The method of claim 3, wherein:
   the first signal and the second signal are sampled 12 times per cycle;
   the second predetermined number is three; and
   the first predetermined number is 144.

10. The method of claim 1, wherein:
    step (a) further comprises the step of storing the current first signal value into a first memory location and storing the current second signal value into a second memory location; and
    step (c) further comprises the step of copying the contents of the second memory location into the contents of the first memory location.

11. The method of claim 1, wherein the first signal is a first electrical current and the second signal is a second electrical current.

12. The method of claim 11, wherein the first electrical current is a current entering a winding of a generator system and the second electrical current is a current leaving the winding.

13. An apparatus for monitoring differentials between a first signal and a second signal, the apparatus comprising:
    (a) means for sampling the first signal and for sampling the second signal for a current sampling interval to provide a current first signal value and to provide a current second signal value;
    (b) means for comparing the first signal with the second signal for the current sampling interval to determine whether there is a difference between the first and second signals for the current sampling interval; and
    (c) means for repairing at least one of the current first signal value and the current second signal value if both:
       (1) a difference is determined for the current sampling interval; and
       (2) for a first predetermined number of previous sampling intervals, fewer than a second predetermined number of repairs have been made.

14. The apparatus of claim 13, wherein the first signal and the second signal are AC signals.

15. The apparatus of claim 14, wherein means (b) comprises means for performing a Fourier dual-slope comparison between the first signal and the second signal.

16. The apparatus of claim 14, wherein: means (a) further comprises means for storing the current first signal value into a first memory location and for storing the current second signal value into a second memory location; and
    means (c) further comprises means for copying the contents of the second memory location into the contents of the first memory location.

17. The apparatus of claim 16, wherein the first signal is a first electrical current and the second signal is a second electrical current.

18. The apparatus of claim 17, wherein the first electrical current is a current entering a winding of a generator system and the second electrical current is a current leaving the winding.

19. The apparatus of claim 18, wherein means (b) comprises means for performing a Fourier dual-slope comparison between the first signal and the second signal.

20. The apparatus of claim 19, wherein:

the first signal and the second signal are sampled 12 times per cycle;

the second predetermined number is three; and the first predetermined number is 144.

21. The apparatus of claim 13, wherein:

means (a) further comprises means for storing the current first signal value into a first memory location and for storing the current second signal value into a second memory location; and means (c) further comprises means for copying the contents of the second memory location into the contents of the first memory location.

22. The apparatus of claim 13, wherein the first signal is a first electrical current and the second signal is a second electrical current.

23. The apparatus of claim 22, wherein the first electrical current is a current entering a winding of a generator system and the second electrical current is a current leaving the winding.

24. A storage medium encoded with machine-readable computer program code for monitoring differentials between a first signal and a second signal, the storage medium comprising:

(a) means for causing a computer to sample the first signal and for sampling the second signal for a current sampling interval to provide a current first signal value and to provide a current second signal value;

(b) means for causing the computer to compare the first signal with the second signal for the current sampling interval to determine whether there is a difference between the first and second signals for the current sampling interval; and (c) means for causing the computer to repair at least one of the current first signal value and the current second signal value if both:

(1) a difference is determined for the current sampling interval;

(2) for a first predetermined number of previous sampling intervals, fewer than a second predetermined number of repairs have been made.

25. The storage medium of claim 24, wherein the first signal and the second signal are AC signals.

26. The storage medium of claim 25, wherein means (b) comprises means for causing the computer to perform a Fourier dual-slope comparison between the first signal and the second signal.

27. The storage medium of claim 25, wherein:

means (a) further comprises means for causing the computer to store the current first signal value into a first memory location and to store the current second signal value into a second memory location; and means (c) further comprises means for causing the computer to copy the contents of the second memory location into the contents of the first memory location.

28. The storage medium of claim 27, wherein the first signal is a first electrical current and the second signal is a second electrical current.

29. The storage medium of claim 28, wherein the first electrical current is a current entering a winding of a generator system and the second electrical current is a current leaving the winding.

30. The storage medium of claim 29, wherein means (b) comprises means for causing the computer to perform a Fourier dual-slope comparison between the first signal and the second signal.

31. The storage medium of claim 30, wherein:

the first signal and the second signal are sampled 12 times per cycle;

the second predetermined number is three; and the first predetermined number is 144.

32. The storage medium of claim 24, wherein:

means (a) further comprises means for causing the computer to store the current first signal value into a first memory location and to store the current second signal value into a second memory location; and means (c) further comprises means for causing the computer to copy the contents of the second memory location into the contents of the first memory location.

33. The storage medium of claim 24, wherein the first signal is a first electrical current and the second signal is a second electrical current.

34. The storage medium of claim 33, wherein the first electrical current is a current entering a winding of a generator system and the second electrical current is a current leaving the winding.

\* \* \* \* \*